United States Patent [19]

Matsuki et al.

[11] Patent Number: 5,502,411
[45] Date of Patent: Mar. 26, 1996

[54] FREQUENCY SYNTHESIZER

[75] Inventors: Toru Matsuki, Tokyo; Atsushi Inahashi, Saitama, both of Japan

[73] Assignee: NEC Corporation, Tokyo, Japan

[21] Appl. No.: 300,528

[22] Filed: Sep. 6, 1994

[30]      Foreign Application Priority Data

Sep. 6, 1993   [JP]   Japan ................. 5-220758

[51] Int. Cl.$^6$ ............................ H03B 19/00; H03K 5/00
[52] U.S. Cl. .......................... 327/156; 327/106; 327/551; 327/113; 327/157; 331/17
[58] Field of Search ................... 327/150, 151, 327/156, 157, 159, 160, 161, 241, 244, 552, 384, 551, 106, 165, 113; 331/17

[56]            References Cited

U.S. PATENT DOCUMENTS

5,095,279   3/1992   Quan et al. ................. 327/106
5,247,265   9/1993   Norimatsu .................. 331/17

*Primary Examiner*—Timothy P. Callahan
*Assistant Examiner*—Dinh T. Le
*Attorney, Agent, or Firm*—Young & Thompson

[57]            ABSTRACT

A frequency synthesizer is disclosed which has a PLL (Phase Locked Loop) made up of voltage controlled oscillator (VCO), variable frequency divider, phase comparator, charge pump, and loop filter. A reference signal source feeds a reference signal to the phase comparator and comprises a reference signal oscillator and a fixed frequency divider. A first and a second waveform converting circuit each divides respective comparison outputs of the phase comparator to produce a charge control signal voltage and a discharge control signal voltage meant for the charge pump. The division of the output periods of the comparison outputs successfully reduces spurious components which are apart from the center frequency of the synthesizer by integral multiples (inclusive of 1) of the reference frequency.

7 Claims, 6 Drawing Sheets

FREQUENCY SYNTHESIZER

BACKGROUND OF THE INVENTION

1. Field of the Invention

The present invention relates to a frequency synthesizer feasible for a transmitter/receiver included in an automobile telephone system or similar mobile communications system and, more particularly, to a frequency synthesizer capable of reducing spurious components away from the center frequency of an output signal by integral multiples of a reference signal.

2. Description of the Related Art

A frequency synthesizer using a PLL (Phase Locked Loop) has customarily been used as, for example, a local oscillator included in the transmitter/receiver of a mobile communications system, e.g., automobile telephone system. This type of frequency synthesizer has a voltage controlled oscillator (VCO), variable frequency divider, phase comparator, charge pump, and loop filter. The VCO produces the output signal of the synthesizer. The variable frequency divider divides the frequency of the VCO output and feeds the resulting signal to the phase comparator. Comparing the output of the variable frequency divider with a reference signal having a reference frequency, the phase comparator produces comparison outputs and delivers them to the charge pump. In response, the charge pump applies a charge/discharge control signal to the loop filter having a capacitor therein. The charge/discharge control signal controls the charging and discharging of the capacitor. The resulting control voltage signal from the loop filter is fed to the VCO.

The phase comparator operates at a timing reciprocal to the reference frequency fr and, therefore, causes the charge pump to operate every 1/fr period. Although most of the components having the reference frequency fr are filtered out by the loop filter, the components passed through the filter are superimposed on the control voltage signal and modulates the phase of the VCO output. Consequently, spurious signals which are apart from the reference frequency fr by integral multiples appear in the VCO output. This is particularly conspicuous when the frequency of the synthesizer output is switched.

Moreover, even when the output signals of the phase comparator are absent, the control voltage signal falls since the capacitor of the loop filter is discharged by a leak current. The charge pump, therefore, operates every fr period even after the PLL of the frequency synthesizer has converged, resulting in the spurious signals which are remote from the reference frequency fr by integral multiples. Hence, in the transmitter/receiver of a mobile communications system using such a synthesizer, the apparent C/N ratio of nearby channels is degraded, degrading the selectability of nearby channels.

SUMMARY OF THE INVENTION

It is, therefore, an object of the present invention to provide a frequency synthesizer capable of reducing spurious signals apart from the center frequency of an output signal by integral multiples of a reference frequency.

It is another object of the present invention to provide a frequency synthesizer which enhances the apparent C/N (Carrier-to-Noise) ratio of nearby channels when applied to an automobile telephone system having a channel interval equal to the frequency of a reference signal, thereby preventing nearby channel selectability from being lowered.

A frequency synthesizer of the present invention has a reference signal source for generating a reference signal having a reference frequency. A loop filter having a low-pass characteristic provided with a cut-off frequency lower than the reference frequency. The loop filter outputs a control voltage signal corresponding to a charge/discharge control signal. A VCO outputs a signal having a radio frequency corresponding to the control voltage signal. A variable frequency divider divides the frequency of the signal from the VCO. A digital signal output type phase comparator is responsive to the output of the variable frequency divider and reference signal for producing a first comparison output and a second comparison output. The first comparison output appears over a period of time during which the output of the variable frequency divider is delayed in phase relative to the reference signal. The second comparison output appears over a period of time during which the output of the variable frequency divider is advanced relative to the reference signal. A charge pump is responsive to the first and second comparison outputs for outputting the charge/discharge control signal. A first waveform converting circuit divides the first comparison output into a plurality of output periods within the repetition period of the reference signal and then feeds it to the charge pump. A second waveform converting circuit divides the second comparison output into a plurality of output periods within the repetition period of the reference signal and then feeds it to the charge pump.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

To better understand the present invention, a brief reference will be made to a conventional frequency synthesizer, shown in FIG. 1. The frequency synthesizer plays the role of, for example, a local oscillator included in the transmitter/receiver of an automobile telephone system. As shown, the synthesizer includes a reference signal oscillator 9 for generating a high frequency signal S10 which is stable in frequency. Assume that the frequency of the signal S10 is an integral multiple of the channel interval of the telephone system. A fixed frequency divider 8 divides the frequency of the signal S10 to output a reference signal S9 having a reference frequency fr. A loop filter 2 feeds a control voltage signal S2a to a voltage controlled oscillator (VCO) 1. In response, the VCO 1 outputs a signal S1a having a frequency f0 matching the control voltage signal S2a. A variable frequency divider 6 divides the frequency f0 of the signal S1a to output the resulting signal S8 whose frequency is fv. The division ratio of the frequency divider 6 is equal to a value produced by dividing the required frequency fs of the signal S1a by the reference frequency fr. By changing the division ratio of the frequency divider 6, the synthesizer controls the required frequency fs of the signal S1a to an integral multiple of the reference frequency fr.

Figure 2A:
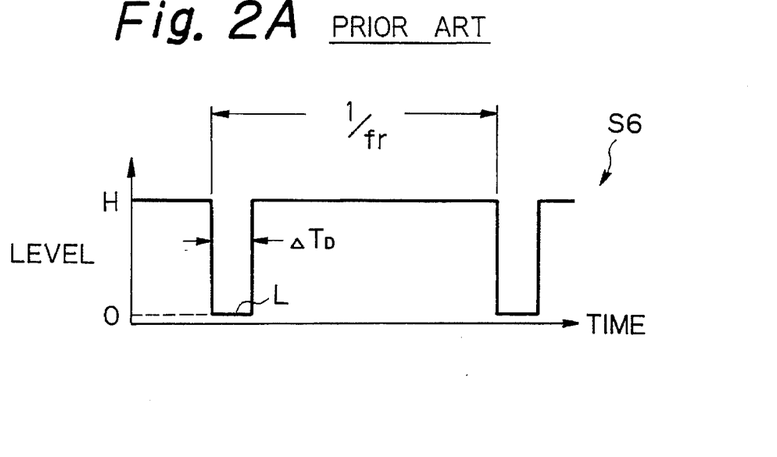
FIGS. 2A and 2B show the waveforms of major signals appearing in the conventional frequency synthesizer.
Figure 2B:
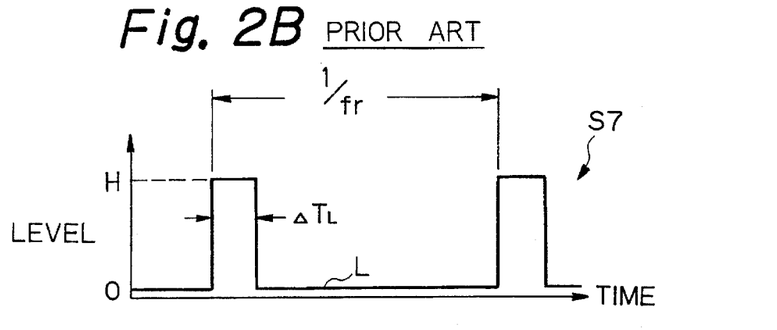

A phase comparator 7 compares the output S8 of the variable frequency divider 6 with the reference signal S9 with respect to phase. The phase comparator 7, which is of a digital signal output type, produces a signal S6 for a period of time $\Delta T_D$ during which the phase of the signal S8 is delayed relative to the reference signal S9, and a signal S7 for a period of time $\Delta T_L$ during which the former is advanced relative to the latter. Specifically, as shown in FIG. 2A, effecting phase comparison every 1/fr period, the phase comparator 7 causes a level, which usually remains in a high level (H), to go low (L) for the period of time $\Delta T_D$ during which the signal S8 is delayed; the comparison output S6 appears over this period of time. At the same time, as shown in FIG. 2B, the phase comparator 6 causes a level, which usually remains in a low level, to go high for the period of time ΔTL during which the signal S8 is advanced; the comparison output S7 appears over this period of time. The phase comparator 7 may be implemented by, for example, an integrated circuit μPD2840IC available from NEC Corporation.

The signals S6 and S7 from the phase comparator 7 are applied to a charge pump 3. The charge pump 3 outputs a charge/discharge control signal S3a matching the inputs S6 and S7 and feeds it to the loop filter 2. The loop filter 2 outputs the previously mentioned control voltage signal S2a by charging a capacitor included therein. The charge/discharge control signal S3a controls the charging and discharging of the capacitor. The comparator output S6 is used to control the charging of the capacitor. For the period of time $\Delta T_D$, the charge pump 3 charges the capacitor with the result that the control voltage signal S2a and, therefore, the frequency f0 of the VCO output S1a rises. The other comparator output S7 is used to control the discharging of the capacitor. For the period of time ΔTL, the charge pump 3 discharges the capacitor so as to lower the control voltage S2a and, therefore, the VCO output S1a.

The charge pump 3 has a PNP transistor Tr1 and an NPN transistor Tr2 which are turned on by the input signals S6 and S7, respectively. The PNP transistor Tr1 has the emitter thereof connected to a +5 V power source and receives the signal S6 at the base thereof. The NPN transistor Tr2 has the collector and emitter thereof connected to the collector of the transistor Tr1 and ground, respectively, while receiving the signal S7 at the base thereof. The charge/discharge control signal S3a appears on the junction of the collectors of the transistors Tr1 and Tr2.

When the signal S6 coupled to the charge pump 3 goes low, the transistor Tr1 is turned on. As a result, the control signal, or charge control signal, S3a charges the capacitor of the loop filter 2, thereby raising the control voltage signal S2a. On the other hand, when the signal S7 goes high, the transistor Tr2 is turned on with the result that the discharge control signal S3a charges the capacitor and thereby lowers the control voltage signal S2a. So long as the signal S8 remains in the same phase as the reference signal S9, the signals S6 and S7 respectively remain in a high level and a low level, respectively, so that the transistors Tr1 and Tr2 are not turned on. In this condition, the charge of the loop filter 2 and, therefore, the frequency f0 of the signal S1a remains constant.

Figure 3:
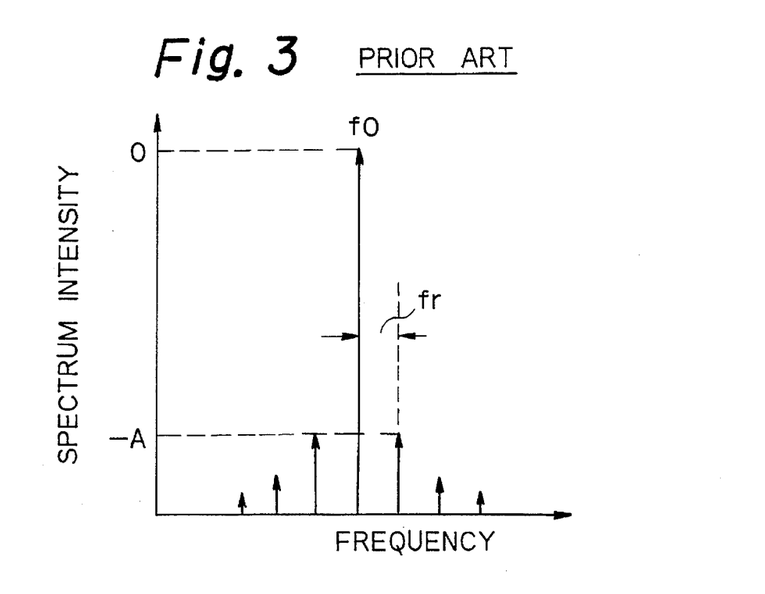
FIG. 3 shows a spectrum particular to the output signal of the conventional frequency synthesizer.

Since the phase comparator 7 compares the signals S8 and S9 every 1/fr period, a component whose frequency is fr exists in the comparator outputs S6 and S7 and, therefore, in the charge/discharge control signal S3a. When this component having the frequency fr is superposed on the control voltage signal S2a, the output signal S1a will contain a spurious component whose frequency is n×fr (n being an integer) apart from the frequency f0. In light of this, the loop filter 2 is provided with a low-pass characteristic, i.e., a cut-off frequency fc lower than the reference frequency fr, thereby preventing the fr component from being superposed on the control voltage signal S2a. However, since the synthesizer has to switch the frequency thereof while causing it to converge in less than a predetermined period of time, the attenuation of the reference frequency fr available with the loop filter 2 is limited. As a result, the output S1a of the VCO 1 suffers from a significant amount of spurious components other than the frequency f0 component, as shown in FIG. 3 specifically.

In the frequency synthesizer described above, the phase comparator 7 operates at a timing reciprocal to the reference frequency fr and, therefore, causes the charge pump 3 to operate every 1/fr period, as stated earlier. Although most of the components having the reference frequency fr are filtered out by the loop filter 2, the components passed through the filter 2 are superimposed on the control voltage signal S2a and modulates the phase of the VCO output S1a. Consequently, spurious signals which are apart from the reference frequency fr by integral multiples appear in the output signal S1a. This is particularly conspicuous when the frequency of the output signal S1a is switched.

Moreover, even when the output signals S6 and S7 of the phase comparator 7 are absent, the control voltage signal S2a falls since the capacitor of the loop filter 2 is discharged by a leak current. The charge pump 3, therefore, operates every fr period even after the PLL of the frequency synthesizer has converged, resulting in the spurious signals which are remote from the reference frequency fr by integral multiples. Hence, in the transmitter/receiver of a mobile communications system using such a frequency synthesizer, the apparent C/N ratio of nearby channels is degraded, thereby degrading the selectability of nearby channels.

Figure 4:
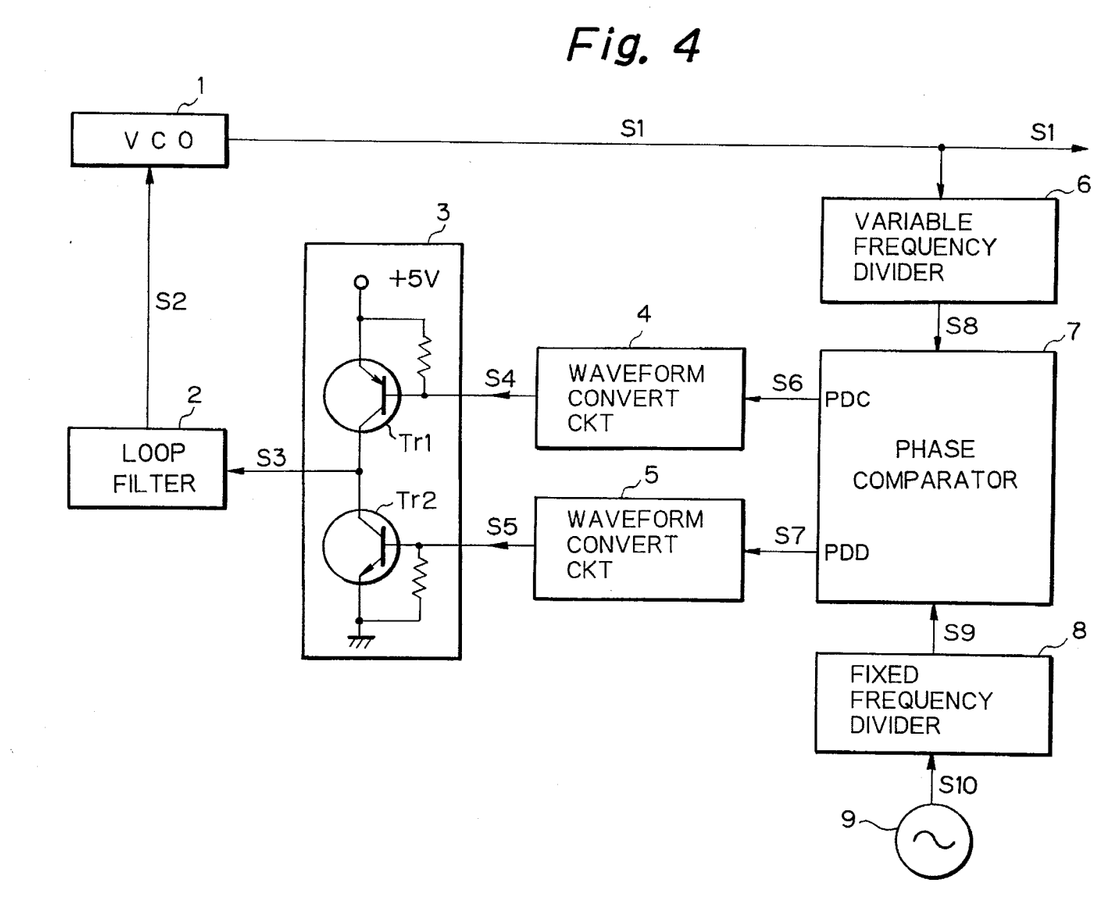
FIG. 4 is a block diagram schematically showing a frequency synthesizer embodying the present invention.
Figure 5A:
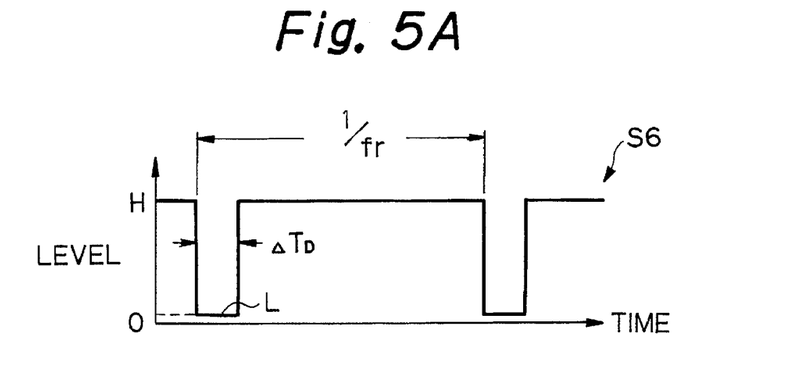
FIGS. 5A–5F show the waveforms of major signals appearing in the embodiment.
Figure 5B:
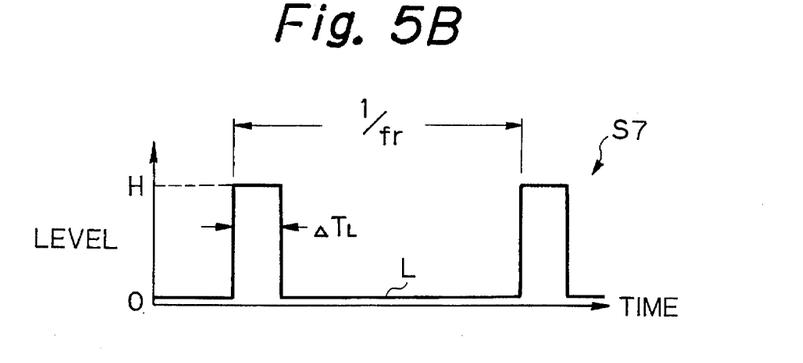
Figure 5C:
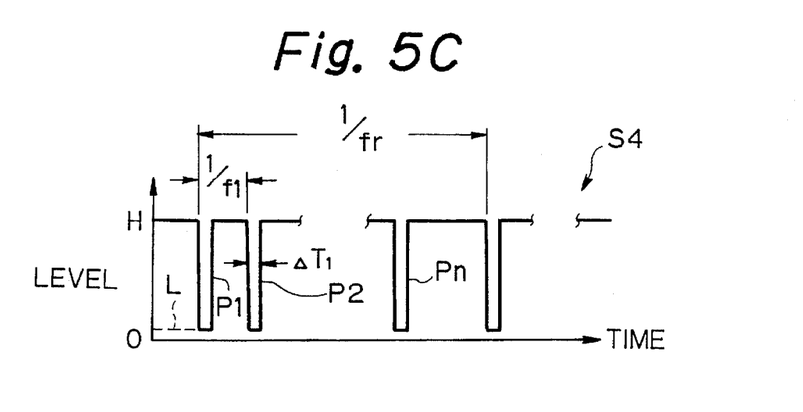
Figure 5D:
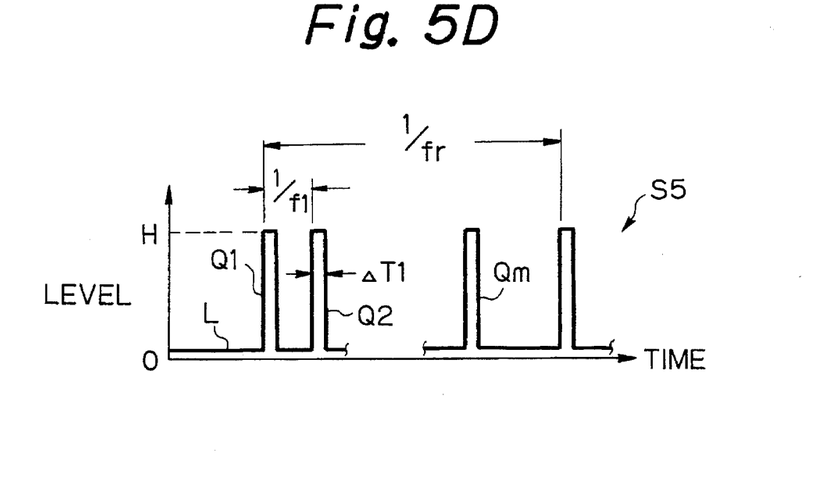
Figure 5E:
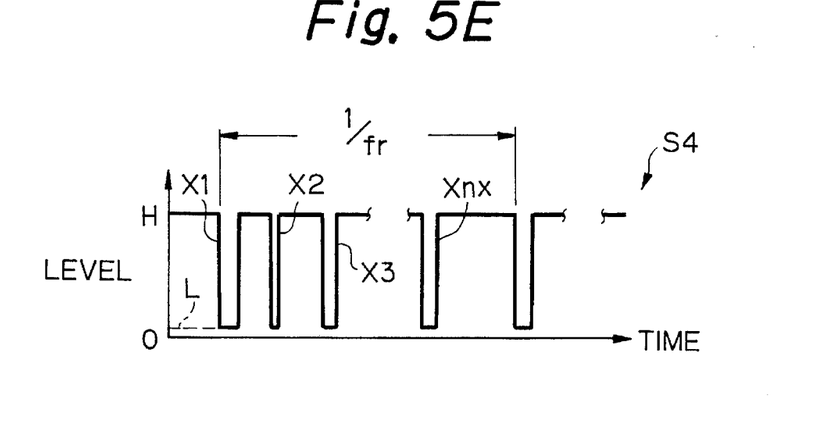
Figure 5F:
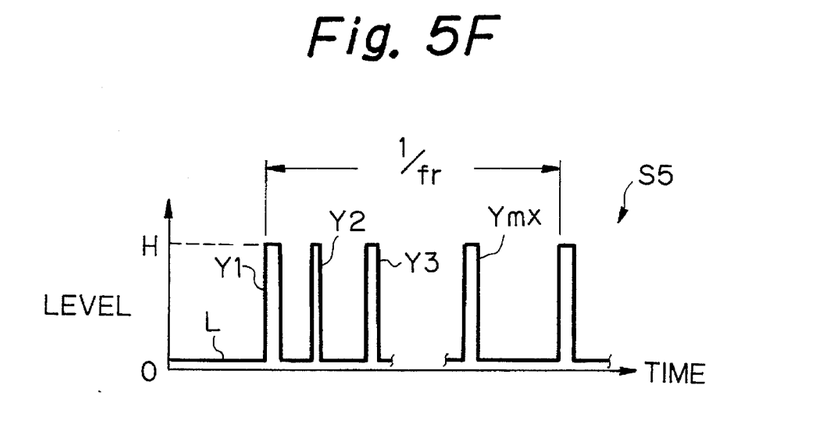
Figure 6A:
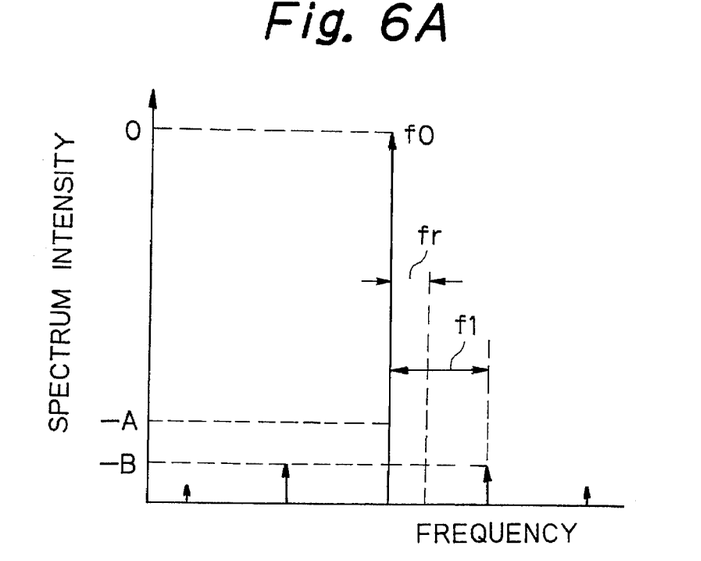
FIGS. 6A and 6B each shows a spectrum particular to the output signal of the embodiment.
Figure 6B:
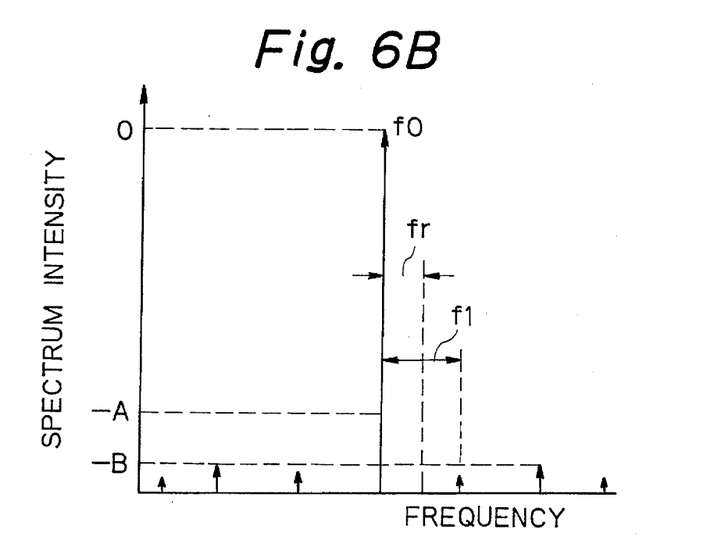

Referring to FIGS. 4, 5A–5F, 6A and 6B, a frequency synthesizer embodying the present invention will be described. FIG. 5A–5F show the waveforms of major signals appearing in the embodiment. Specifically, FIGS. 5A and 5B respectively show comparison outputs S6 and S7, FIGS. 5C and 5E show a charge control voltage signal S4, and FIGS. 5D and 5F show a discharge control voltage signal S5. FIG. 6A shows the spectrum of an output signal S1 to occur when the comparison outputs S6 and S7 are respectively divided into the voltage signals S4 and S5 each having constant intervals. FIG. 6B shows a spectrum to occur when the control voltages S4 and S5 each have intervals which are not constant.

Figure 1:
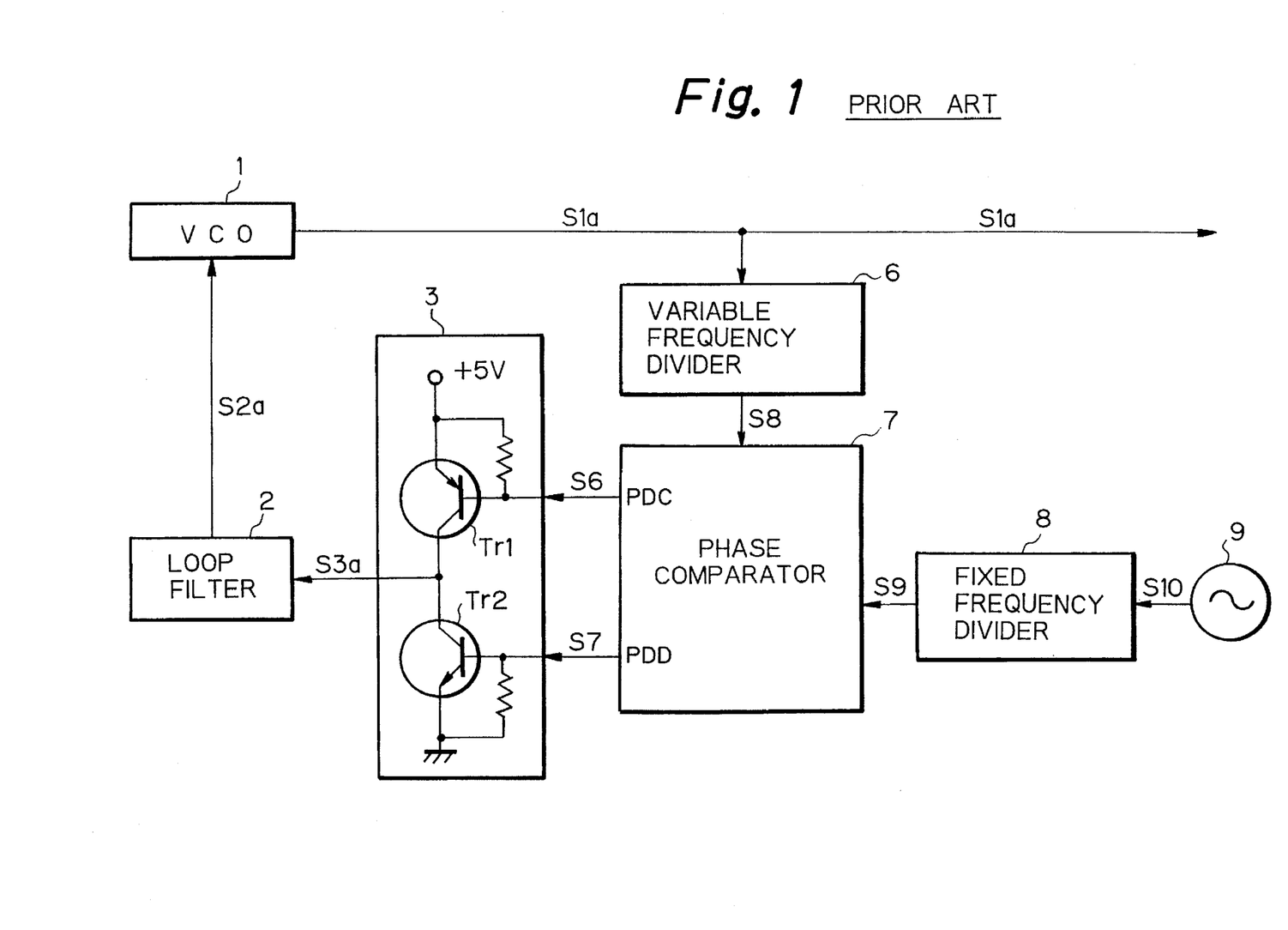
FIG. 1 is a block diagram schematically showing a conventional frequency synthesizer.

As shown, the frequency synthesizer has waveform converting circuits 4 and 5 in addition to the conventional VCO 1, loop filter 2, charge pump 3, variable frequency divider 6, phase comparator 7, fixed frequency divider 8, and reference signal oscillator 9 shown in FIG. 1. The conventional constituents 1, 2, 3, 6, 7, 8 and 9 will not be described specifically in order to avoid redundancy.

The waveform converting circuit 4 divides the low level (L) period $\Delta T_D$, during which the comparison output S6 appears (see FIG. 5A), into a plurality of periods within the repetition period 1/fr of a reference signal S9. The resulting output, or charge control signal, S4 of the circuit 4 is applied to the base of the PNP transistor Tr1 included in the charge pump 3. The waveform conversion is executed under the following conditions:

$$tn - t1 < 1/fr \tag{1}$$

$$\sum_{i=1}^{n} \Delta Ti = \Delta T_D \tag{2}$$

where n is the number into which the comparison output S6 is divided, $\Delta Ti$ is the i-th low level period of the charge control signal S4, t1 is the time when the low level of the charge control signal S4 begins, and tn is the time when the low level of the signal S4 ends. The relation (1) indicates that all the charge control signals S4 lie in the repetition frequency 1/fr of the reference signal S9, i.e., the frequency components of the charge control signals S4 are higher than the reference frequency fr. The equation (2) indicate that the period for charging the capacitor of the loop filter 2 is the same as the period in the conventional synthesizer shown in FIG. 1.

The waveform converting circuit 5 divides the high level (H) period $\Delta T_L$, during which the comparison output S7 appears (see FIG. 5B), into a plurality of periods within the repetition period 1/fr of a reference signal S9. The resulting output, or discharge control signal, S5 of the circuit 5 is applied to the base of the PNP transistor Tr2 also included in the charge pump 3. This waveform conversion is executed under the following conditions:

$$tm - t1 < 1/fr \tag{3}$$

$$\sum_{j=1}^{n} \Delta Tj = \Delta T_L \tag{4}$$

where m is the number into which the comparison output S7 is divided. $\Delta Tj$ is the j-th high level period of the discharge control signal S5, t1 is the time when the high level of the signal S5 begins, and tm is the time when the high level of the signal S5 ends. The relation (3) indicates that all the discharge control signals S5 lie in the repetition frequency 1/fr of the reference signal S9, i.e., the frequency components of the discharge control signals S5 are higher than the reference frequency fr. The equation (4) indicate that the period for discharging the capacitor of the loop filter 2 is the same as the period in the conventional synthesizer shown in FIG. 1.

The output period (low level) $\Delta T_D$ of the comparison output S6 and the output period (high level) $\Delta T_L$ of the comparison output S7 are divided by a first method or a second method, as follows.

A first method divides the output period of the signal S6 into n (2 or greater integer) output periods P1–Pn having the same time interval 1/f1 and the same duration (time width) $\Delta T1$, thereby producing the charge control signal S4 (see FIG. 5C). Of course, the interval 1/f1 and duration $\Delta T1$ must satisfy the above conditions (1) and (2) at the same time. Likewise, the output period of the signal S7 is divided into m (2 or greater integer) output periods Q1–Qm having the same time interval 1/f1 and the same duration (time width) $\Delta T1$, whereby the discharge control signal S5 is produced (see FIG. 5D). The interval 1/f1 and duration $\Delta T1$ should, of course, satisfy the above conditions (3) and (4) at the same time.

When the charge control signal S4 and discharge control signal S5 generated by the first method are applied to the charge pump 3, the transistors Tr1 and Tr2 are each turned on at the period of 1/f1. Since the charge pump 3 controls the loop filter 2 with the charge/discharge control signal S3 containing the components of frequency f1, the control voltage signal S2 contains the frequency f1 and higher harmonics thereof. However, the frequency f1 and higher harmonics thereof superimposed on the control voltage S2 are suppressed more than the frequency fr and higher harmonics thereof superimposed on the control voltage S2a of the conventional circuitry since f1 is higher than fr. Hence, the spurious signals of the output signal S1 attributable to the phase modulation of the VCO 1 have the spectrum peak thereof suppressed (see FIG. 6A).

The output periods $\Delta T_D$ and $\Delta T_L$ of the comparison outputs S6 and S7, which are the phase errors of the PLL loop, are scattered during the period 1/fr. However, the PLL loop does not oscillate since it eventually operates only during $\Delta T_D$ and $\Delta T_L$ within the period 1/fr.

In the illustrative embodiment, the spurious components of the output signal S1 are apart from the frequency f0 of the signal S1 by integral multiples of the frequency f1, i.e., more remote than the spurious components of the conventional circuitry. Hence, in the automobile telephone system, the embodiment obviates the spectrum in which nearby channels are apart from each other (±fr) and allows the C/N ratio of nearby channels to appear as if it were improved. This enhances the selectability of nearby channels.

A second method for dividing the output periods $\Delta T_D$ and $\Delta T_L$ is as follows. The output period $\Delta T_D$ of the signal S6 is divided into nx (2 or greater integer) output periods Xi (X1–Xnx) having irregular time intervals, thereby producing the charge control signal S4 (see FIG. 5E). In the specific waveform of FIG. 5E, the interval between nearby output periods Xi is also irregular. Again, the total output period of the control signal S4 is confined in the period 1/fr, while the total output period Xi is equal to $\Delta T_D$. Likewise, the output period $\Delta T_L$ of the signal S7 is divided into mx (2 or greater integer) output periods Yj (Y1–Ymx) having irregular time intervals, thereby producing the discharge control signal S5 (see FIG. 5F). In the specific waveform of FIG. 5F, the interval between nearby output periods Yj is also irregular. The total output period of the control signal S5 is confined in the period 1/fr, while the total output period Yj is equal to $\Delta T_L$.

When the charge control signal S4 and discharge control signal S5 respectively have the specific waveforms shown in FIGS. 5E and 5F, the switching frequency components of the signal passing through the loop filter 2 are random. Hence, the spectrum of the switching frequency components applied to the VCO 1 do not concentrate. It follows that the spurious components of the VCO output signal S1 are further apart from the reference frequency (±fr) and scattered (see FIG. 6B). The second method, therefore, reduces the spurious components of the output signal S1 more than the first method. It is to be noted that the second method is capable of reducing spurious components even when either the output period or the duration of each control signal is irregular.

Figure 7:
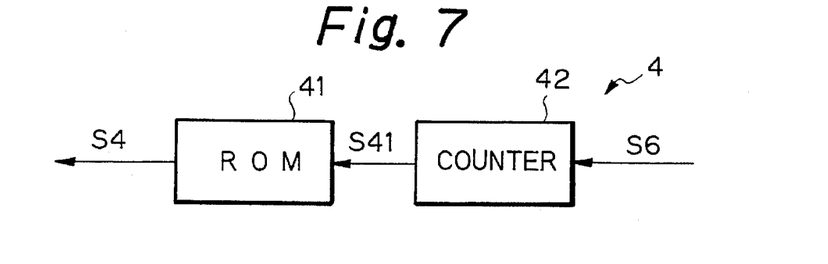
FIG. 7 is a block diagram schematically showing a specific construction of a waveform converting circuit included in the embodiment.

FIG. 7 shows a specific construction of the waveform converting circuit 4. As shown, the circuit 4 is implemented as a digital signal processor (DSP) and includes a counter 42. The counter 42 counts the output periods (low levels) of the comparison output S6 fed thereto from the phase comparator 7 and delivers an address signal S41 matching the count to a ROM (Read Only Memory) 41. The ROM 41 stores charge control signals S4 in the form of patterns each matching a particular address signal S41. In response to the address signal S41, a charge control signal S4 matching it is read out of the ROM 41 and fed to the charge pump 3. The patterns stored in the ROM 41 are logical patterns in which the total output period of the charge control signal S4 is equal to the output periods $\Delta T_D$ counted by the counter 42 and is distributed within the period of time $1/fr$. The other waveform converting circuit 5 may also be implemented by the circuitry of FIG. 7 and is operated in the same way except for the polarity of the input comparison signal S7.

In summary, it will be seen that the present invention provides a frequency synthezier in which spurious components included in the output of a VCO and deviated from a reference frequency are driven out to remote frequencies and reduced in intensity. This advantage is derived from a unique configuration wherein the outputs of a phase comparator are each converted to a signal whose frequency is higher than the reference frequency and then applied to a charge pump. When such a synthesizer is applied to a transmitter/receiver included in, for example, an automobile telephone system having a channel interval equal to the reference frequency, the apparent C/N ratio and, therefore, the selectability of nearby channels is enhanced.

Various modifications will become possible for those skilled in the art after receiving the teachings of the present disclosure without departing from the scope thereof.

What is claimed is:

1. A frequency synthesizer comprising:

a reference signal source for generating a reference signal having a reference frequency;

a loop filter having a low-pass characteristic provided with a cut-off frequency lower than said reference frequency, said loop filter outputting a control voltage signal corresponding to a charge/discharge control signal;

a VCO for outputting a signal having a radio frequency corresponding to said control voltage signal;

a variable frequency divider for dividing the frequency of said signal from said VCO;

a digital signal output type phase comparator responsive to an output of said variable frequency divider and said reference signal for producing a first comparison output and a second comparison output, said first comparison output appearing over a period of time during which said output of said variable frequency divider is delayed in phase relative to said reference signal, said second comparison output appearing over a period of time during which said output of said variable frequency divider is advanced relative to said reference signal;

a charge pump responsive to said first and second comparison outputs for outputting said charge/discharge control signal;

a first waveform converting circuit for dividing said first comparison output into a plurality of output periods within a repetition period of said reference signal and for feeding said divided first comparison output to said charge pump; and a second waveform converting circuit for dividing said second comparison output into a plurality of output periods within a repetition period of said reference signal and for feeding said divided second comparison output to said charge pump;

said first and second waveform converting circuits converting said first and second comparison outputs to signals whose frequency is higher than said reference frequency, thereby to cause spurious components in said VCO output signal apart from a center frequency reduced in intensity.

2. A frequency synthesizer as claimed in claim 1, wherein said first and second comparison outputs are a charge control signal and a discharge control signal, respectively.

3. A frequency synthesizer as claimed in claim 2, wherein said charge pump comprises a PNP transistor having an emitter connected to a positive power source, and an NPN transistor having a collector connected to a collector of said PNP transistor and an emitter connected to ground.

4. A frequency synthesizer as claimed in claim 3, wherein said first and second comparison outputs are respectively connected to a base of said PNP transistor and a base of said NPN transistor, said charge control signal appearing on a junction of said collectors of said PNP transistor and said NPN transistor.

5. A frequency synthesizer as claimed in claim 1, wherein said first and second waveform converting circuits each comprises:

a counter for counting the output periods of the respective comparison output to thereby output an address signal matching said output periods; and a ROM operable at a higher frequency than said counter, and responsive to said address signal for producing said divided comparison output and having a predetermined pattern.

6. A frequency synthesizer as claimed in claim 1, wherein said first and second comparison outputs are each divided into output periods having a same duration.

7. A frequency divider as claimed in claim 1, wherein said first and second comparison outputs each has an interval and a duration at least one of which is not constant.

* * * * *